US010444647B2

(12) United States Patent
Bijnen et al.

(10) Patent No.: US 10,444,647 B2
(45) Date of Patent: Oct. 15, 2019

(54) METHODS AND APPARATUS FOR DETERMINING THE POSITION OF A TARGET STRUCTURE ON A SUBSTRATE, METHODS AND APPARATUS FOR DETERMINING THE POSITION OF A SUBSTRATE

(71) Applicant: ASML NETHERLANDS B.V., Veldhoven (NL)

(72) Inventors: Franciscus Godefridus Casper Bijnen, Valkenswaard (NL); Augustinus Hubert Maria Boshouwers, Best (NL); Johannes Onvlee, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/307,512

(22) PCT Filed: Jun. 1, 2017

(86) PCT No.: PCT/EP2017/063252
§ 371 (c)(1),
(2) Date: Dec. 6, 2018

(87) PCT Pub. No.: WO2017/215924
PCT Pub. Date: Dec. 21, 2017

(65) Prior Publication Data
US 2019/0219936 A1    Jul. 18, 2019

(30) Foreign Application Priority Data
Jun. 13, 2016   (EP) .................................... 16174142

(51) Int. Cl.
*G03F 9/00*   (2006.01)
*H01L 21/68*  (2006.01)

(52) U.S. Cl.
CPC .......... *G03F 9/7046* (2013.01); *G03F 9/7049* (2013.01); *G03F 9/7084* (2013.01);
(Continued)

(58) Field of Classification Search
None
See application file for complete search history.

(56) References Cited

U.S. PATENT DOCUMENTS 5,648,854 A    7/1997   McCoy et al.
5,739,913 A    4/1998   Wallace
(Continued)

FOREIGN PATENT DOCUMENTS

EP    2339331    6/2011

OTHER PUBLICATIONS

International Search Report and Written Opinion issued in PCT Patent Application No. PCT/EP2017/063252, dated Nov. 9, 2017.
(Continued)

*Primary Examiner* — Michelle M Iacoletti
(74) *Attorney, Agent, or Firm* — Pillsbury Winthrop Shaw Pittman LLP

(57) ABSTRACT

A target structure such as an alignment mark on a semiconductor substrate becomes obscured by an opaque layer so that it cannot be located by an alignment sensor. A position for the mark is determined using an edge position sensor and relative position information that defines the position of the mark relative to one or more edge portions of the substrate is stored prior to formation of the opaque layer. A window can be opened in the opaque layer, based on the determined position. After revealing the target structure, the alignment sensor can, if desired, measure more accurately the position of the target structure, for use in controlling a further lithographic step. The edge position sensor may be a camera
(Continued)

having an angle-selective behavior. The edge position sensor may be integrated within the alignment sensor hardware.

20 Claims, 9 Drawing Sheets

(52) U.S. Cl.
CPC .......... *G03F 9/7088* (2013.01); *H01L 21/681* (2013.01); *H01L 21/682* (2013.01)

(56) References Cited

U.S. PATENT DOCUMENTS

| | | |
|---|---|---|
| 6,297,876 B1 | 10/2001 | Bornebroek |
| 8,731,274 B2 | 5/2014 | Langmans et al. |
| 2003/0081188 A1 | 5/2003 | Suzuki |
| 2006/0222236 A1 | 10/2006 | Osada et al. |
| 2008/0080845 A1 | 4/2008 | Chen et al. |
| 2010/0053603 A1 | 3/2010 | Sakaguchi et al. |
| 2010/0297788 A1 | 11/2010 | Fischer et al. |
| 2011/0317003 A1 | 12/2011 | Porat et al. |
| 2012/0195490 A1 | 8/2012 | Langmans et al. |
| 2013/0215258 A1 | 8/2013 | Gaglin et al. |

OTHER PUBLICATIONS

Van Schoot, Jan, et al.: "0.7 NA DUV Step & Scan System for 150nm Imaging With Improved Overlay", SPIE Symposium on Optical Microlithography, Mar. 1999.

METHODS AND APPARATUS FOR DETERMINING THE POSITION OF A TARGET STRUCTURE ON A SUBSTRATE, METHODS AND APPARATUS FOR DETERMINING THE POSITION OF A SUBSTRATE

CROSS REFERENCE TO RELATED APPLICATIONS

This application is the U.S. national phase entry of PCT patent application no. PCT/EP2017/063252, which was filed on Jun. 1, 2017, which claims the benefit of priority of European patent application no. 16174142.6, which was filed on Jun. 13, 2016, and which is incorporated herein in its entirety by reference.

BACKGROUND

The present invention relates to methods and apparatus usable, for example, in the manufacture of devices by lithographic techniques, and to methods of manufacturing devices using lithographic techniques. The invention relates more particularly to methods and apparatus for determining the position of a mark on a substrate. The invention further relates to methods and apparatus for determining the position of a substrate.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. Mark patterns may be included along with device features in the pattern for a first layer. After chemical and physical processing, the mark becomes a permanent structure for reference in positioning patterns in subsequent layers. In cases where the first device layer is not suitable for forming a mark structure, a "layer zero" pattern may be applied and processed, to form the mark structures suitable for positioning further layers. Such patterns are then referred to as "alignment marks". The position sensor is referred to as the "alignment sensor". A known example of the alignment sensor is disclosed in U.S. Pat. No. 6,297,876 (Bornebroek et al). Further discussion of this sensor and its applications is contained in the paper "0.7 NA DUV STEP & SCAN SYSTEM FOR 150 nm IMAGING WITH IMPROVED OVERLAY" by Jan van Schoot, Frank Bornebroek, and others, presented at the SPIE Symposium on Optical Microlithography March 1999, Santa Clara, Calif., USA.

As soon as new layers are applied on top of the layer containing the alignment marks, the problem arises that position signals obtained using the position sensor are impaired or unobtainable. The mark structure itself may also become distorted by the chemical and physical processes. Many developments and improvements have been made in such position sensors, to improve measurement accuracy under a range of conditions. Additional marks can be formed in subsequent layers, to be used where the original marks are obscured. In some processes, however, a new material layer must be deposited which simply obscures the alignment marks to the extent that position cannot be measured. An example of such a material is tungsten. In order to accurately position device patterns in such a layer, it is generally required to cut openings in the layer to reveal the underlying alignment marks. These windows can be relatively coarsely positioned, but the accuracy required still presupposes some method to determine the position of the underlying marks. Accordingly, different methods have been devised to ensure that some identifiable marks are visible in the opaque layer, for example by forming topographical features prior to deposition of the opaque layer material. Such methods involve additional process steps and costs, as well as occupying additional space ("real estate") on the substrate.

SUMMARY OF THE INVENTION

The present invention in a first aspect aims to allow the position of a mark to be determined despite the presence of an overlying structure, without the need for costly additional pattering and processing steps.

The present invention in another aspect aims to allow the position of a substrate to be determined accurately, without reliance on marks which may become impaired or obscured.

The invention in a first aspect provides a method of locating a target structure on a substrate, the mark being obscured by an overlying structure, the method comprising:
  (a) providing relative position information that defines the position of the mark relative to one or more edge portions of the substrate, said relative position information having been defined prior to formation of said overlying structure;
  (b) after formation of said overlying structure, measuring the positions of said edge portions; and
  (c) based on the positions of said edge portions measured in step (b) and the relative position information provided in step (a), deriving a position of the target structure;
  wherein in one or both of steps (a) and (b) the position of the edge portion is measured by using a camera to acquire images of an edge region of the substrate, and
  wherein an optical system of the camera is angle-selective such that a portion of said edge region having a specific bevel angle is accentuated in said images.

In an embodiment the method further comprises a step of: (d) using the derived position of the target structure to remove a portion of said overlying structure to reveal the target structure. In a further embodiment the method comprises a step of: (e) after revealing the target structure, measuring more accurately the position of the target structure than is derived in step (c).

In an embodiment the camera may form part of a sensor that is used for measuring the position of the target structure in step (e).

In an embodiment the measurement of a more accurate position in step (e) is performed using an alignment sensor that is the same as or similar to an alignment sensor used for measuring the position of the target structure in step (a).

In a further embodiment the method further comprises a step of: (f) using the more accurate position of the target structure in a lithographic process step to control the positioning of one or more patterns applied to the substrate.

In an embodiment step (b) further comprises determining an orientation of the substrate, and the step (c) uses the determined orientation in deriving the position of the target structure in step (c). The orientation of the substrate may be measured by measuring the positions of edge portions in the vicinity of an orienting feature formed in the edge of the substrate. Alternatively, the orientation of the substrate is measured by recognizing the orientation of a pattern distributed across the substrate. The distributed pattern may be recognized in topographic variations obtained by measuring a height across a surface of the substrate. The distributed pattern may comprise a grid pattern.

In an embodiment step (a) includes:
(a1) prior to formation of said target structure, measuring the positions of said edge portions; and
(a2) forming said target structure at a position defined relative to the measured positions of the edge portions of the substrate.

In another embodiment step (a) includes:
(a1) after formation of said target structure but prior to the formation of said overlying structure, measuring the positions of said edge portions and measuring the position of the target structure; and
(a2) recording said relative position information for subsequent use in step (c), based on the positions measured in step (a1).

In an embodiment the target structure is an alignment mark for use in positioning patterns to be applied to the substrate.

In an embodiment the overlying structure is a layer of material opaque to one or more wavelengths of sensing radiation.

In an embodiment the substrate is a semiconductor wafer.

The invention in the first aspect further provides an apparatus for locating a target structure on a substrate, the apparatus comprising:
storage for relative position information that defines the position of the mark relative to one or more edge portions of the substrate;
an edge position sensor operable to measure the positions of said edge portions; and
a processor arranged to calculate, based on measured positions of said edge portions and the relative position information provided in said storage, deriving a position of the target structure;
wherein said edge position sensor comprises a camera operable to acquire images of an edge region of the substrate, and wherein an optical system of the camera is angle-selective such that a portion of said edge region having a specific bevel angle is accentuated in said images.

In an embodiment the edge position sensor is operable to measure the positions of said edge portions while an overlying structure obscures the target structure, and wherein said apparatus further comprises a position sensor operable to measure more accurately the position of the target structure, after a portion of said overlying structure has been removed.

In an embodiment said camera forms part of the position sensor for measuring more accurately the position of the target structure.

In an embodiment the processor is further arranged to use a determined orientation of the substrate in calculating the position of the target structure.

In an embodiment the processor is arranged to determine the orientation of the substrate using positions of edge portions obtained by said edge position sensor in the vicinity of an orienting feature formed in the edge of the substrate.

In an embodiment the processor is arranged to determine the orientation of the substrate by recognizing the orientation of a pattern distributed across the substrate.

In an embodiment the distributed pattern is recognized in topographic variations obtained by a height sensor across a surface of the substrate.

In an embodiment the distributed pattern comprises a grid pattern.

The invention in the first aspect further provides a lithographic apparatus for use in applying a pattern to a substrate, the lithographic apparatus including an apparatus according to the invention and a controller for using the calculated position of the target structure to control the positioning of one or more patterns applied to the substrate.

The invention in the first aspect further provides a lithographic apparatus for use in applying a pattern to a substrate, the lithographic apparatus including an apparatus according to the invention and a controller for controlling the positioning of a pattern defining said target structure using the measured positions of the edge portions of the substrate.

The lithographic apparatus may be adapted for use where said substrate is a semiconductor wafer.

Using the substrate edge as a reference allows a target structure such as the alignment mark to be located without additional patterning steps. The marks can be formed at a defined position relative to the edges, or the relative position can be measured after formation of the marks, but before they become obscured.

The invention in a second aspect provides a method of measuring the position of a substrate wherein a camera is used to acquire images of an edge region of the substrate, wherein an optical system of the camera is angle-selective such that a portion of said edge region having a specific bevel angle is accentuated in said images.

In an embodiment the camera further includes a source of illumination aligned with an optical axis of the camera.

In an embodiment the angle-selective camera is part of a sensor adapted for measurement of the position of a target structure formed on a substrate. In a further embodiment the sensor is an alignment sensor in a lithographic apparatus.

In an embodiment the substrate is a semiconductor wafer.

The invention in the second aspect further provides an apparatus for measuring the position of a substrate, the apparatus comprising a camera operable to acquire images of an edge region of the substrate, wherein an optical system of the camera is angle-selective such that a portion of said edge region having a specific bevel angle is accentuated in said images.

The camera may be based on hardware already provided within the alignment sensor of a lithographic apparatus.

In an embodiment the camera further includes a source of illumination aligned with an optical axis of the camera.

In an embodiment the angle-selective camera is part of a sensor adapted for measurement of the position of a target structure formed on a substrate. In a further embodiment the sensor is an alignment sensor for a lithographic apparatus.

In an embodiment the apparatus is adapted for use where said substrate is a semiconductor wafer.

The invention yet further provides computer program products comprising machine-readable instructions for causing one or more programmable processors to implement the processor and controlling steps of methods and apparatuses according to the invention set forth above. The computer program product may comprise a non-transitory storage medium storing said machine-readable instructions.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
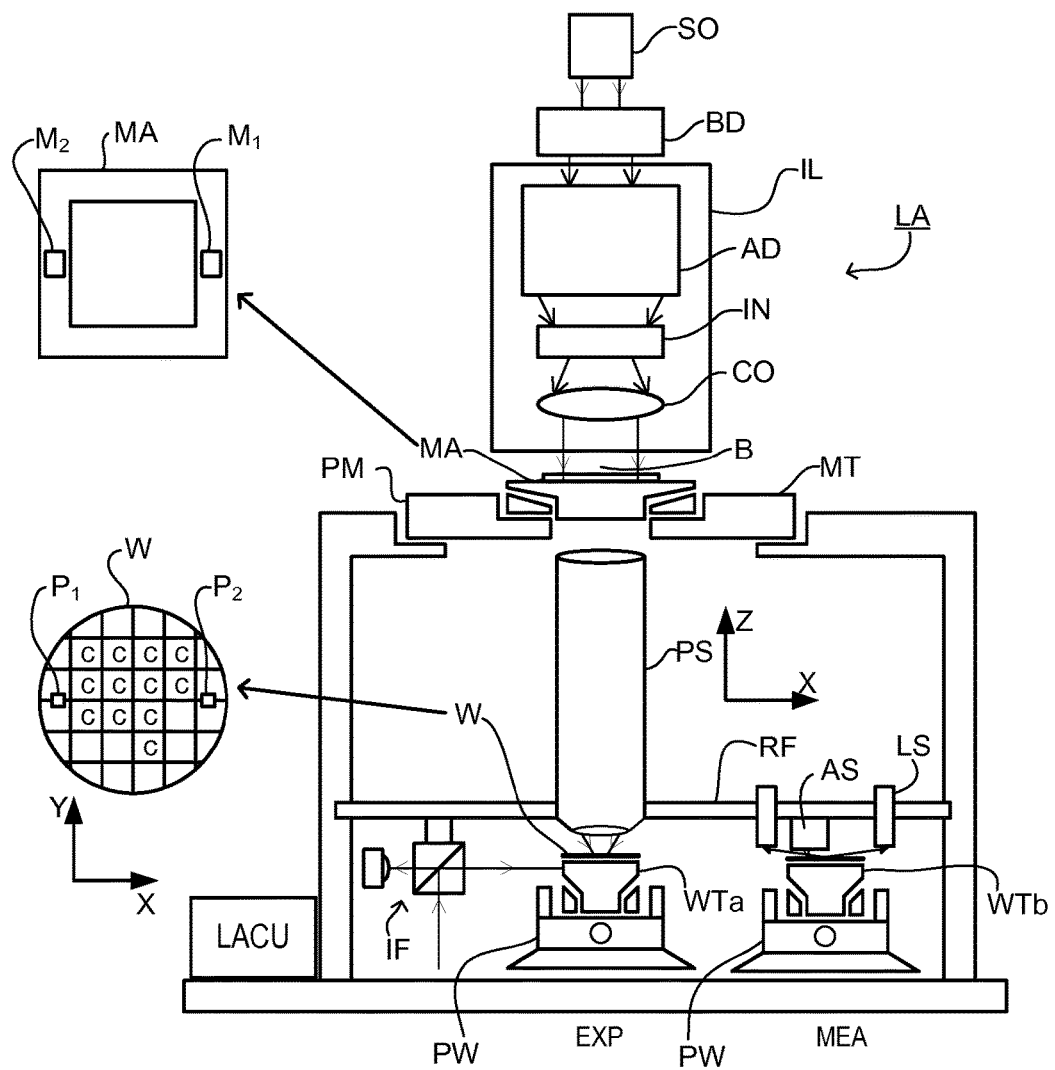
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers, is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
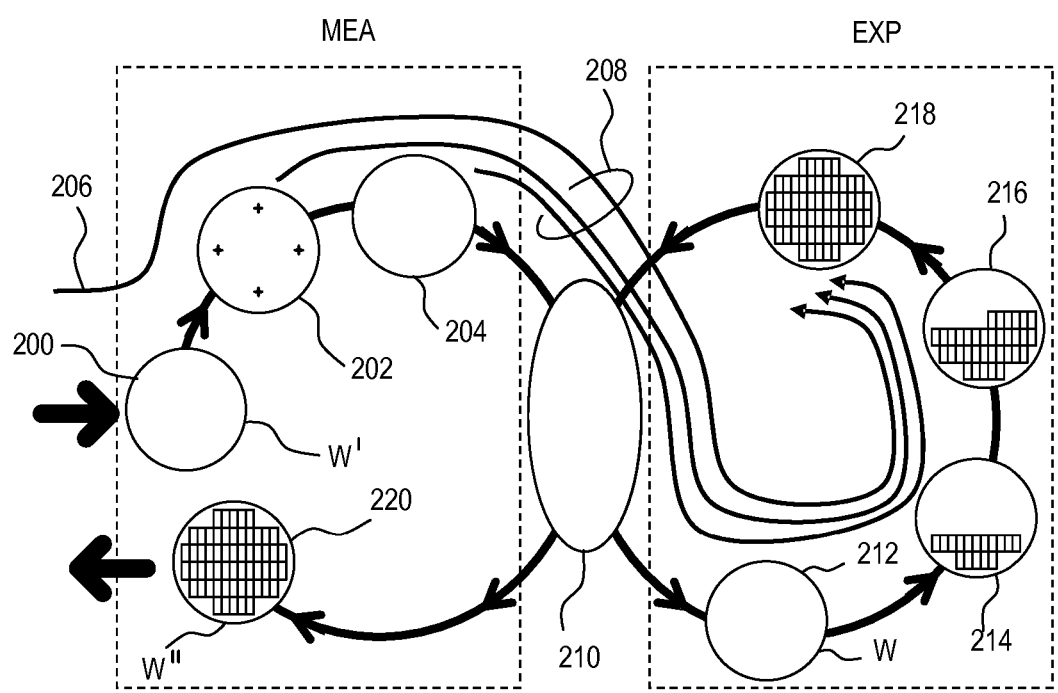
FIG. 2 illustrates schematically measurement and exposure processes in the apparatus of FIG. 1, according to known practice and modified in accordance with an embodiment of the present invention.

FIG. 2 illustrates the steps to expose target portions (e.g. dies) on a substrate W in the dual stage apparatus of FIG. 1. The process according to conventional practice will be described first.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa, WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

In some processes, processing of layers on the substrate after the alignment mark has been formed leads to situations in which the marks cannot be found by the alignment sensor due to low or no signal strength. A low or zero signal strength can be caused for example by opaque layers on top of the marks which block the operation of the alignment sensor.

Figure 3:
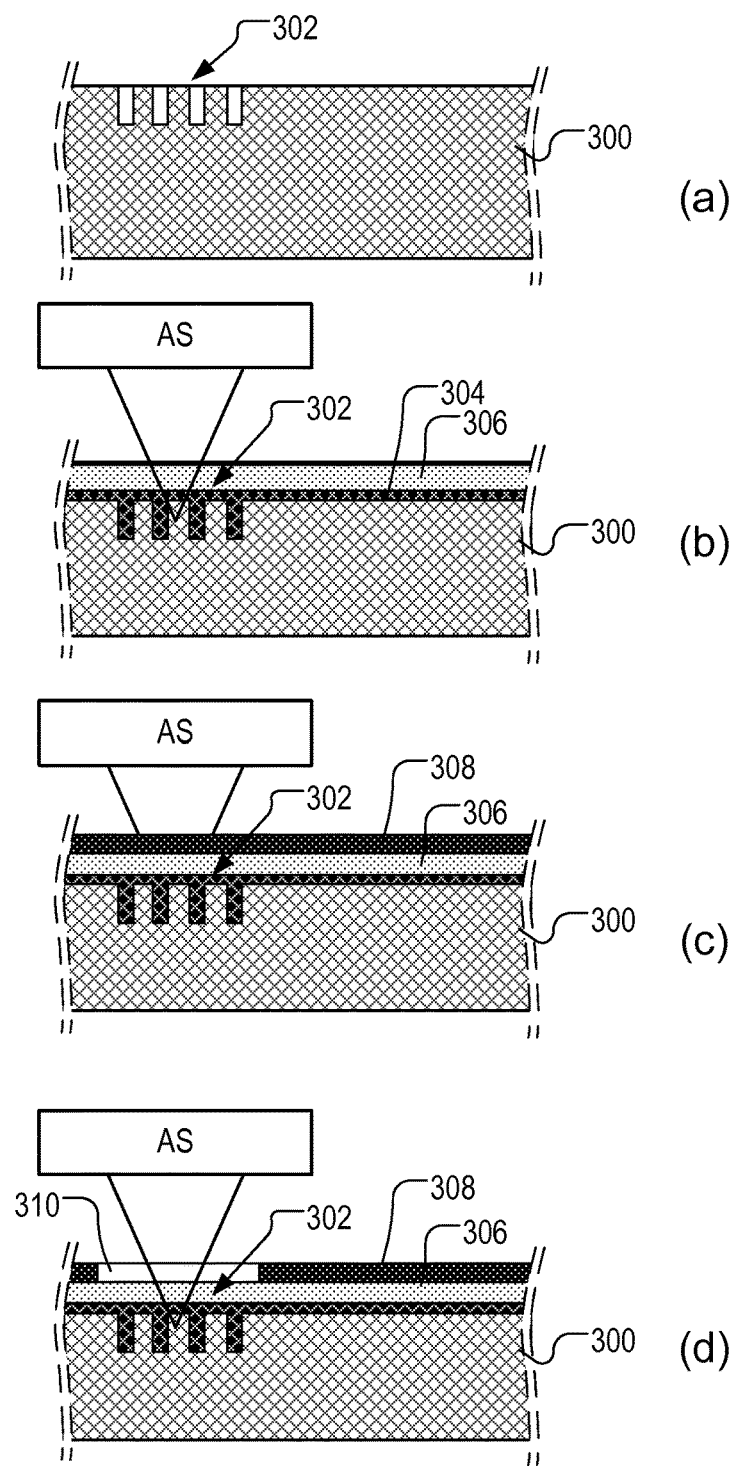
FIG. 3 illustrates schematically the use of a position sensor to measure the position of a target structure formed on a substrate, and a problem of and opaque overlying structure.

FIG. 3 illustrates the problem (features in these drawings are shown schematically, and not to scale). A portion of the substrate is shown in cross-section at 300. FIG. 3(a) shows the condition of the substrate when a grating structure has been formed to serve as an alignment mark 302. It will be understood that this mark 302 is merely one of a plurality of marks present across the substrate. Different types of marks may be provided, to suit different sensors and/or different process conditions. Different marks may be provided for coarse position measurements and fine position measurements. Features defining the grating have been applied to the blank material of the substrate using the lithographic apparatus LA or a similar apparatus to form a pattern in a resist layer, and then chemically or physically etching the applied pattern to form trenches and so define the permanent grating structure. These trenches may subsequently become filled with a material of another layer 304. The patterning to form the grating structure may be performed as part of a first layer processing of the substrate, in which the same patterning step also applies first layer device features. Alternatively, in some processes, it is preferable to form the alignment mark 302 in a dedicated step, which may be referred to as "layer 0".

As seen at (b), alignment sensor AS in the lithographic apparatus can be used to read the position of the mark 302, even as it becomes buried under overlying structures such as material layers 304 and 306. The known alignment sensors generally offer the capability to read using different wavelengths of radiation, so as to penetrate typical overlying structures. On the other hand, some materials used in the construction of the device may be opaque to any of the radiation available for use in the alignment sensor. At (c) in FIG. 3, a layer 308 has been added. This may be, for example, a layer of metal such as tungsten, or a carbon hard mask layer. Layer 308 is applied in preparation for imparting a pattern to it, to form a functional layer of the device, or to form a hard mask for etching the layer below. However, layer 308 is opaque to the radiation of the alignment sensor AS.

In case layer 308 also does not leave any topographic features by which the mark may be found, accurate positioning of the pattern to define features in the layer 308 becomes impossible without additional measures. For example, it is known to produce additional marks in subsequent layers to facilitate mark detection. However, the production of these additional marks is expensive. These additional marks can be avoided if an optical window is opened on top of the existing marks, in such a way that only the material which is located on top of the marks is removed and therefore the marks can be measured. This yields the situation shown in FIG. 3 (d), where a window 310 has been opened in the opaque layer 308, only in the vicinity of the underlying mark 302. As further illustrated, the opening of the window 310 allows alignment sensor AS to read the position of the mark 302, so that the lithographic apparatus can accurately position a subsequent pattern on the layer 308.

This optical window, known as "clear-out", needs to be done with a certain positional accuracy, otherwise die yield will be affected by cutting out parts of the layer which are needed to remain for a functional device. By modifying the topography of the layer beneath the opaque layer 308, it is possible to provide alignment marks which can be detected accurately enough to allow positioning of the clear-out windows. However, these also require additional processing steps and costs.

Figure 4:
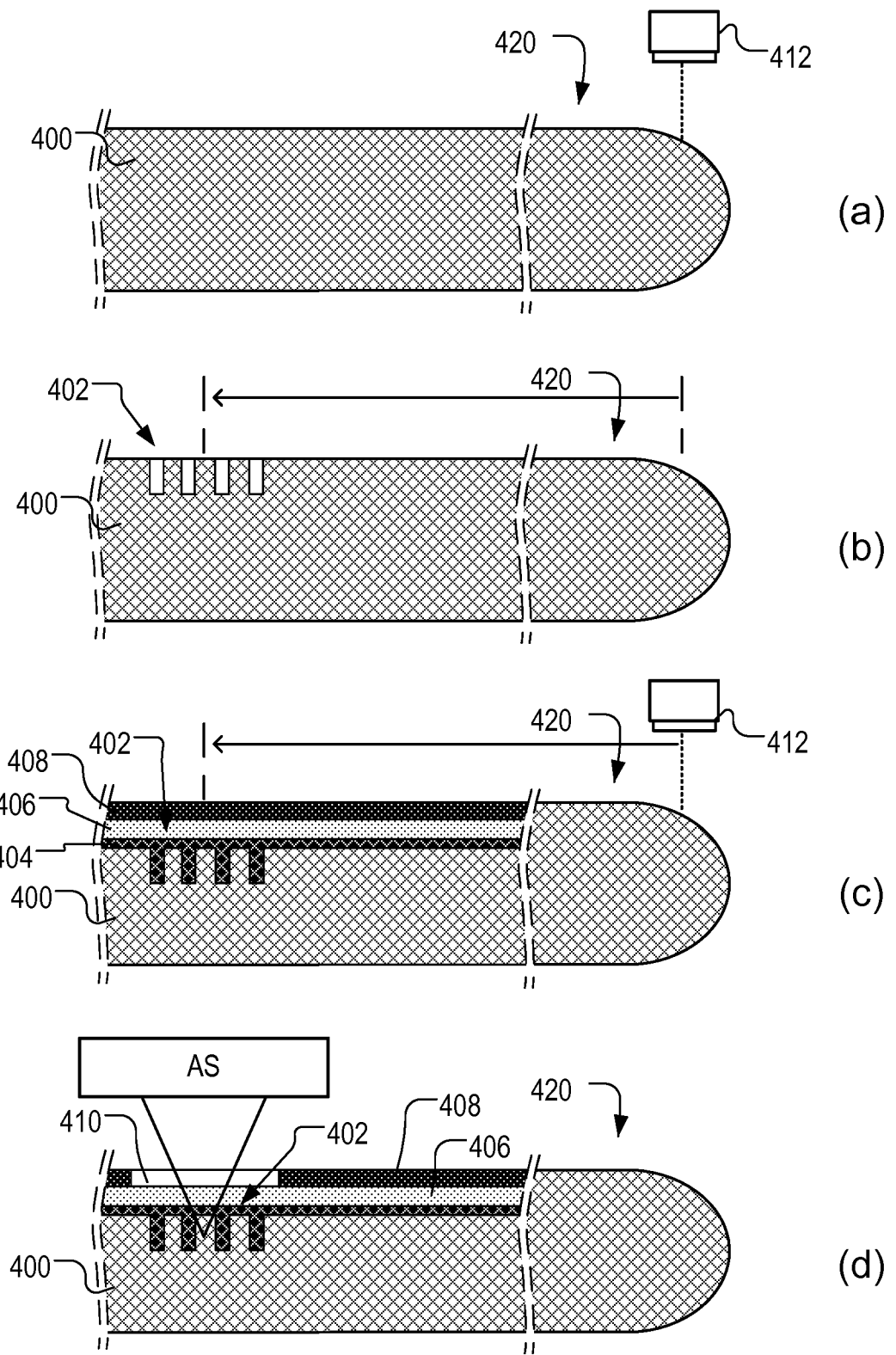
FIG. 4 illustrates schematically a method of determining the position of a target structure in a first embodiment of the invention.

FIG. 4 illustrates an alternative solution, based on using edge portions 420 of a substrate 400 as a reference, for determining the position of a mark, despite the presence of an overlying structure. The blank substrate material is labeled 400, and other structures have the same labeling as in FIG. 3, but with prefix '4' instead of '3'. Thus, over the sequence of steps illustrated at FIG. 4(a) to (d) and mark 402, an overlying structure including layers 404, 406 and an opaque layer 408 is formed, and a window 410 is opened in the opaque layer. Instead of providing special marks that can be read by the alignment sensor, the method of FIG. 4 uses an edge sensor 412 to measure the position of edge portions 420 of the substrate, and calculates the position of the hidden mark 402 based on the measured positions of the edge portions.

Edge sensor 412 may be regarded as a camera. In particular embodiments of the present disclosure, to be described in more detail below, an optical system of the camera is made specifically sensitive to certain angles of radiation, so that a certain portion of a rounded beveled edge 422 of the substrate 400 will be accentuated in some way in an image captured by the camera. In other embodiments, not illustrated, the camera can be provided to observe contrast in the image and identify the edge of the substrate in that way. Whichever embodiment is implemented, of course suitable illumination is included in the optical system. Illumination can be provided through the optical system, or from some external source, directed at the substrate edge or at the substrate support below it.

As will further be seen below, the camera suitable for use as edge sensor 412 may already be present in the alignment sensor AS of the lithographic apparatus LA. In some types of alignment sensors, the camera is already angle-selective, for reasons unrelated to the detection of the substrate edge. In other cases, a simple modification can transform the camera into one which is angle-selective. Examples below will be presented based on the alignment sensor described in the patent and paper, mentioned in the introduction.

Referring to the method of FIG. 4 in more detail, steps (a) and (b) in this example show the steps of forming the mark 402, in the first layer or "layer 0" patterning step. At (a), we see the sensor 412 measuring, or determining, a position of the edge of the substrate 400, before mark 402 has been formed. At (b) the mark is formed by patterning, etching and filling steps in the same way as were used to form the mark 302 in FIG. 3. This time, however, the position of mark 402 is controlled so that it has a known position relative to the edge of the substrate. Of course, a one-dimensional relative position is illustrated, while the real substrate has edge portions that can be measured in two dimensions, and the position of the mark is defined in two dimensions. Also, as mentioned already, mark 402 in practice may be one of several or many marks positioned across the substrate. The positions of all these marks 402, relative to the edges of the substrate 400, are recorded for future reference. They may be recorded within the lithographic apparatus, and/or they may be recorded and passed along with the substrate as part of the recipe data mentioned in FIG. 2.

Referring to FIG. 4 (c) now, the layer 406 and opaque layer 408 have been applied overlying the mark 402, so that it can no longer be read, or detected, by the alignment sensor. However, the position of the edge of the substrate can be read, or detected, by the sensor 412. By measuring again the positions of the edge portions of the substrate, and by using the stored relative positions of the marks, the position of the mark 402 can be calculated. The window 410 can be opened at a desired position, as shown in FIG. 4(d).

As already described, lithographic apparatus LA already includes extremely accurate encoders for tracking any movements of the substrate table and the substrate loaded upon it, relative to reference frame RF. Accordingly, the full accuracy of these positioning systems can be harnessed, to obtain a very accurate record of the relative position of the marks and the substrate edge. The accuracy of positioning the window 410 is therefore limited primarily by the accuracy of measuring the positions of the edge. However, using the techniques disclosed herein, it is believed that positioning of the window 410 can be performed with sufficient accuracy that there is no longer a requirement for additional, so-called coarse, alignment marks to be provided. Furthermore, potentially, accurate measurement of the edge position of the substrate may be used as a substitute for the coarse alignment marks being provided. The space occupied normally by coarse alignment marks can thereby be freed up for other use.

Figure 5:
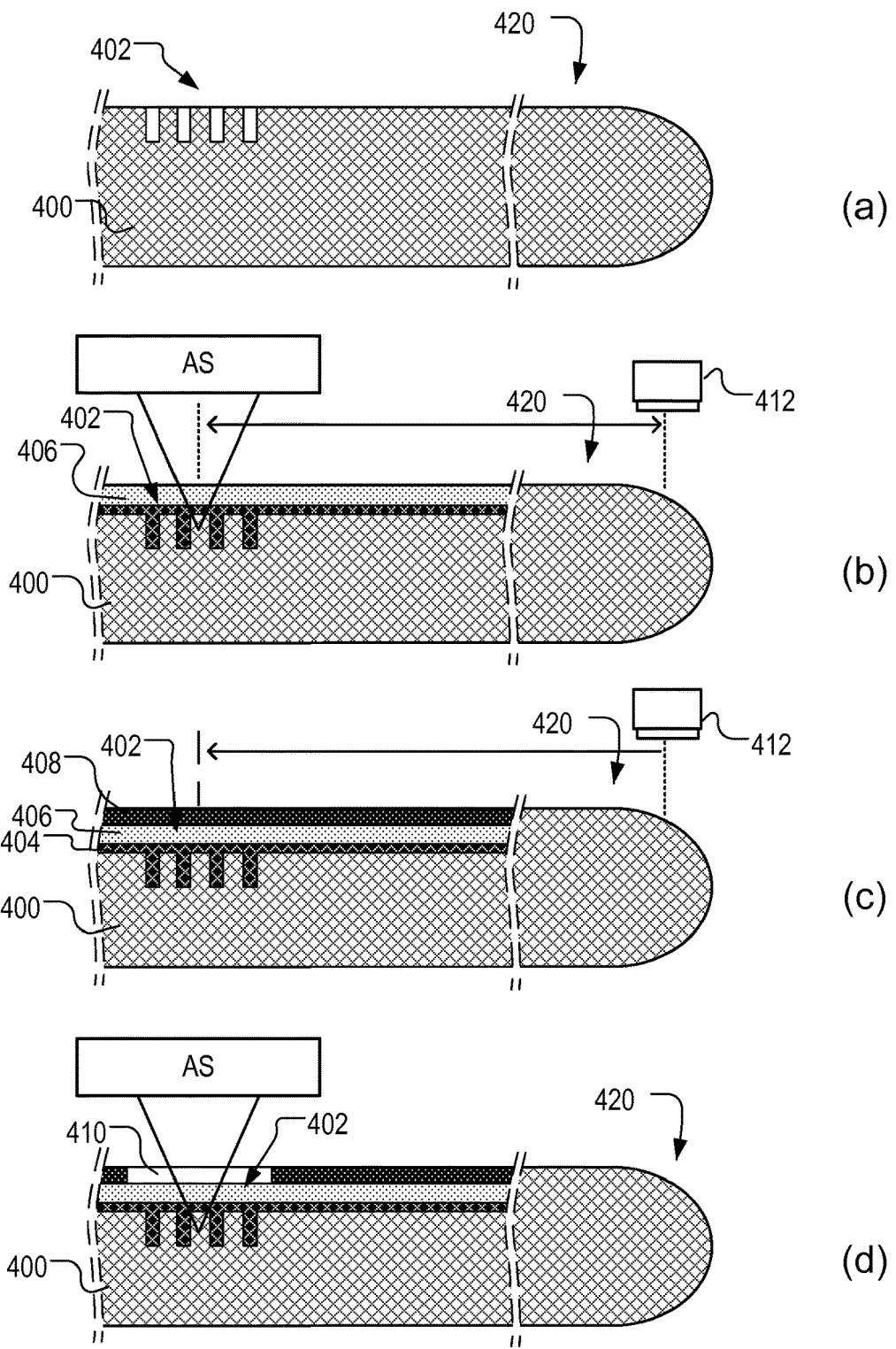
FIG. 5 illustrates schematically a method of determining the position of a target structure in a second embodiment of the invention.

FIG. 5 presents another method, in which the same result can be achieved. Parts labeled 400 to 422 are present, exactly as they were in FIG. 4. The method steps (a) to (d) are very similar, except that the position of the edge of the substrate is not measured using sensor 412 until after mark 402 has been formed in step (a). As seen in step (b), provided that mark 402 can still be detected and used by the alignment sensor AS, its position relative to the substrate edge can be calculated using measurements made by the edge sensor 412. Both position measurements will be made with the substrate loaded into the lithographic apparatus on the substrate table WTa or WTb. As already described, lithographic apparatus LA already includes extremely accurate encoders for tracking any movements of the substrate table and the substrate loaded upon it, relative to reference frame RF. Accordingly, the full accuracy of these positioning systems can be harnessed, to obtain a very accurate record of the relative position of the marks and the substrate edge.

Provided the measurement of the relative position is made before application of the opaque overlying layer 408, the edge sensor 412 and the recorded relative positions can be used for the windows 410 in steps (c) and (d) just as in the method of FIG. 4.

In the schematic drawings of FIGS. 4 and 5, the edge region is shown unchanging, while other regions receive various layers of materials. In practice, all parts of the substrate may be subject to chemical and physical processing to apply layers. The edge regions in these drawings are shown remaining "clean" only for simplicity. The position measurements can be adjusted and calibrated, if necessary, to correct for changes in the edge region that would affect the position measurements.

Figure 6:
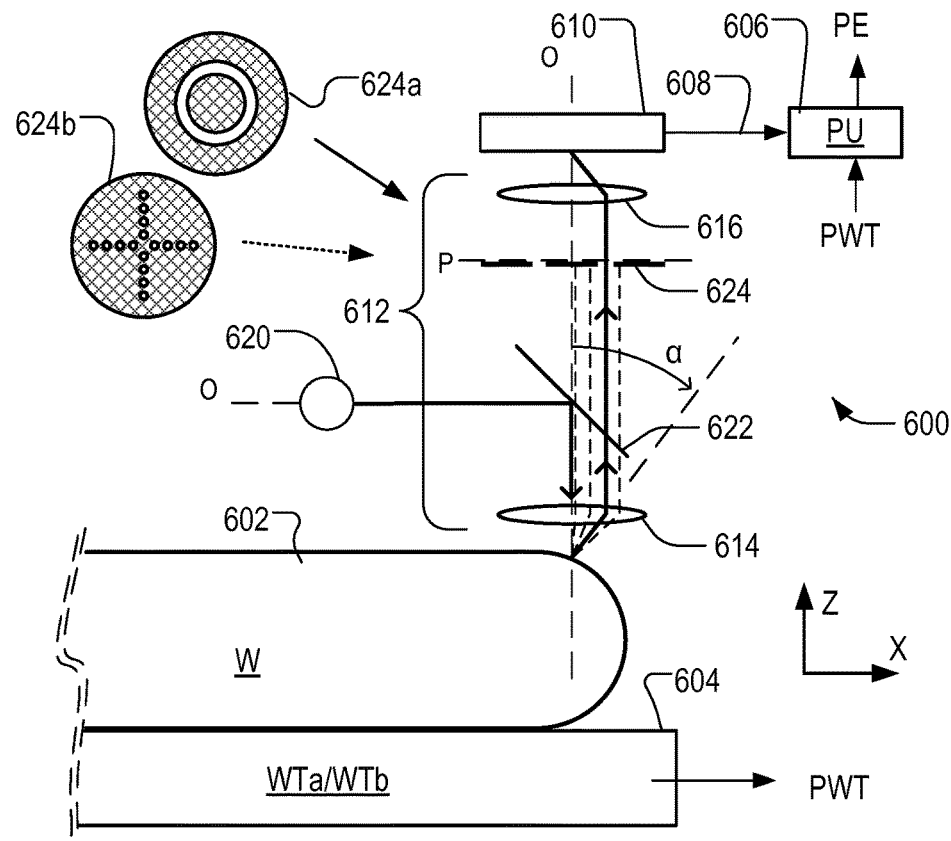
FIG. 6 illustrates the operation of an angle selective camera in embodiments of the invention.
Figure 6:
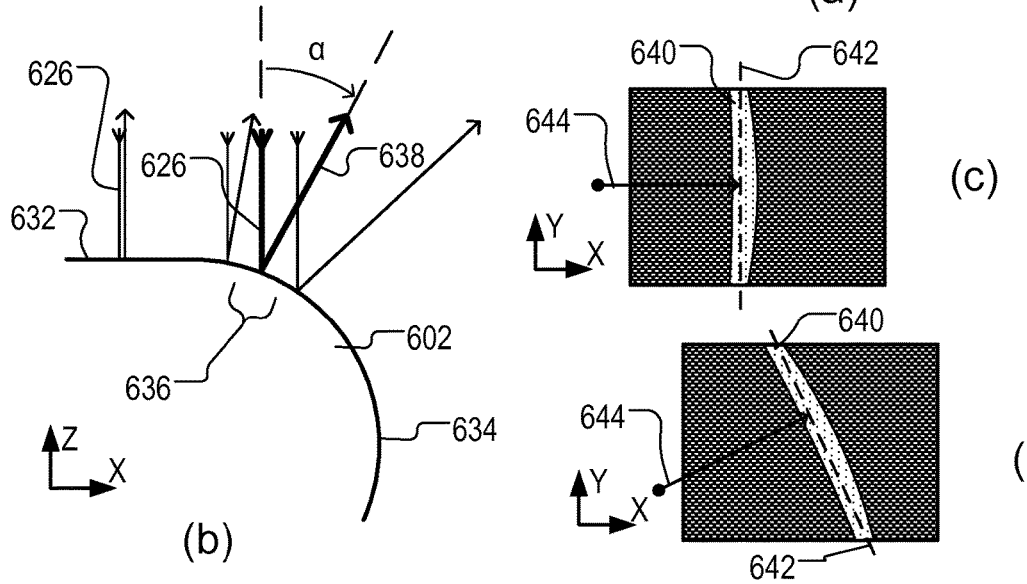

FIG. 6 illustrates the principle of operation of the edge sensor 412 in one particular embodiment of the present disclosure. The edge sensor in this embodiment may be described as an angle-selective camera. This camera may be the existing camera of an existing alignment sensor, it may be a modification of the existing camera of an existing alignment sensor, or it may be a separate camera, provided specifically for the edge position detection. Needless to say, using the existing hardware is attractive for reasons of cost and space. Alignment sensors of the type described in the prior patent and paper mentioned above are present in many semiconductor fabrication facilities throughout the world.

In FIG. 6, substrate 602 is mounted on a substrate table 604. Positioning information PWT is output by the various sensors and servo systems of the lithographic apparatus, and is input to a processor 606. Also input to processor 606 is image data 608 from an image sensor 610 of angle-selective camera. Image sensor 610 may be a conventional CCD or CMOS sensor comprising an array of photodetectors, corresponding to pixels of a captured image. An optical system 612 forms an image of the substrate on the image sensor 610. The optical system in this example is represented by a pair of lenses 614, 616, although of course a more complex optical system may be expected in practice. Illumination for the camera is provided through lens 614, using a suitable light source 620 and a part-reflective surface 622.

The components described so far would implement a conventional camera. A conventional camera could be used, with suitable illumination and image processing, as one method of measuring the position of the edge of the substrate. In the present example, however, the camera is an angle-selective camera through the inclusion of an aperture device 624, in a pupil plane P of the optical system. As is known to those skilled in the art, points in the pupil plane, correspond to angles of radiation in an image plane, that is to say the angle of radiation at the substrate surface, and the angle of radiation on the image detector 610. By placing an aperture in the pupil plane which selects only certain angles, the angle-selective camera can be made to accentuate in the captured images only those features which lie at a particular angle relative to the illuminating radiation 626.

Example aperture devices 624a and 624b are shown in plan view as inset details in FIG. 6(a). These are illustrated purely schematically, and not to scale. The first aperture device 624a comprises an annular opening at a predetermined distance around the optical axis. This distance corresponds, as already mentioned, to an angle α at the input to the optical system 612. Referring now to the enlarged detail of the edge portion of the substrate at FIG. 6(b), various ways of illumination and reflected radiation are illustrated. The illumination is directed vertically in relation to the plane of the substrate, and coincides with the optical axis O of the camera optical system 612. The edge of substrate 602 has a rounded bevel form, which curves with increasing angle from the flat portion 632 to the extreme edge portion 634. Therefore, rays of the illuminating radiation 626 are reflected in different directions by different portions of the substrate edge.

Of all the rays of illuminating radiation 626 that impinge upon the substrate surface, only those rays in a specific region of the bevel shape portion labeled 636 will be reflected as rays 638 traveling at the predetermined angle α relative to the optical axis. Consequently, only these rays can pass through the aperture device 624 to contribute to the formation of an image on the image sensor 610. FIG. 6(c) shows such an image schematically. Rather than being a conventional image of the substrate and its surroundings, the angle-selective behavior of the optical system 612 results in an image which accentuates particularly the portion 636 of the substrate edge, and suppresses other portions. In the example illustrated, this accentuation results in a bright stripe 640 across the image. When this image is supplied to processor 606, a line 642 can be fitted through the pixels of the bright stripe. A measurement 644 can be obtained of the position of the edge relative to the reference frame RF.

The angle selective camera can be moved to various positions around the edge of the substrate, until sufficient measurements are obtained, as will be illustrated below. FIG. 6(d) illustrates how the angle of the bright part 640, and consequently the fitted line 642, changes around the periphery of the substrate. Taking as many samples as desired, processor 606 can deliver edge position measurements PE for use in the methods described above with reference to FIGS. 4 and 5.

Referring to the alternative aperture device 624b, it will be seen that this aperture device does not have an annular opening, but rather one or more openings arranged along the X and Y axes only. It happens that some existing alignment sensors have a camera with such an aperture device effectively within them, as will be explained further below. The positioning of the apertures is tuned to the expected diffraction angles of diffraction orders of the alignment mark grating, when illuminated with particular wavelengths of radiation. Thus the optical system of the alignment sensor is already angle-selective, for the purpose of selecting different diffraction orders. Using the same type of aperture device in the vicinity of the substrate edge, the angle-selective property of the known optical system can be exploited to achieve the same result as is illustrated in FIG. 6(c). A restriction of using aperture device 624b, however, is that the angled portion 636 of the substrate edge will only be accentuated in the captured images, when the reflected ray is aligned with the X or Y direction. For example, an image with a sloping portion of the edge, as seen in FIG. 6(d), would not be captured using the second aperture device. Nevertheless, it may be sufficient to achieve accurate position measurement of the substrate, if the position of the edge can be measured at North, South, East and West positions. In practice, as will be seen, the field of view of the camera is sufficient to capture many such sample images even in a small segment of the substrate periphery. The field of view of the camera in the known alignment sensor is less than half of 1 mm, while the diameter of a typical substrate is 300 mm.

Figure 7:
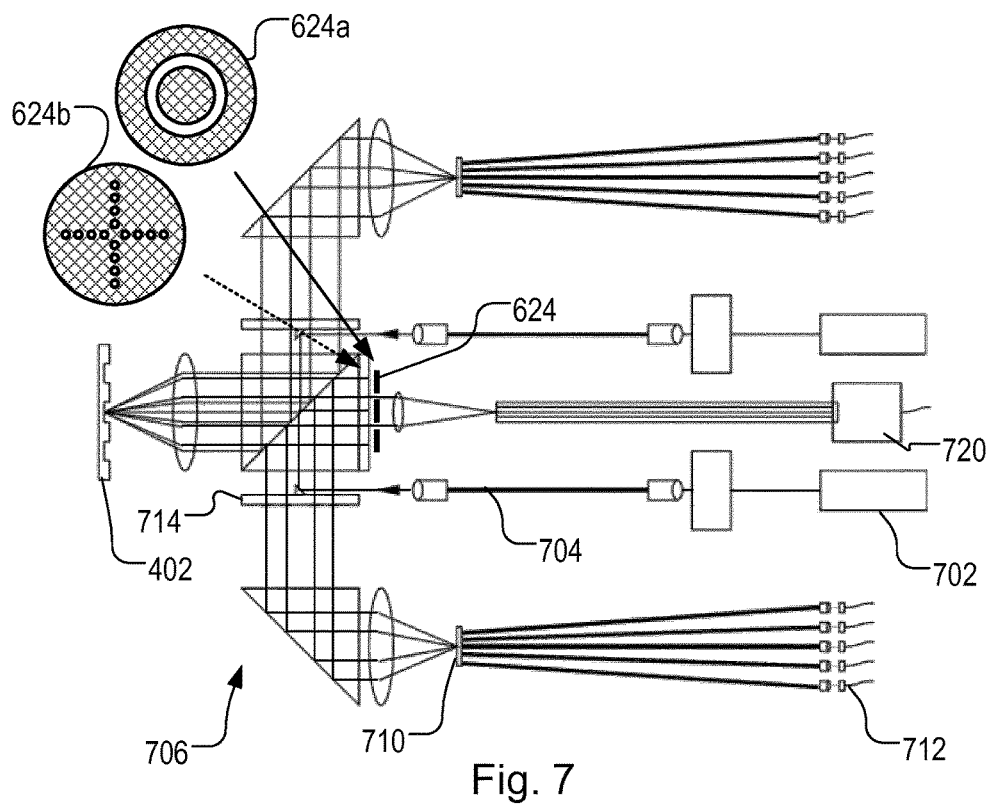
FIGS. 7 and 8 illustrate schematically the integration of an angle-selective camera in a position sensor usable in a lithographic apparatus.

FIG. 7 reproduces the drawing of the known alignment sensor from the paper by van Schoot et al, referred to in the introduction. For full details of the design and operation of such a sensor, reference should be made to the patent and the paper, contents of which are hereby incorporated by reference. As explained in the paper, the known alignment sensor has two optical systems, which operate using different wavelengths of radiation, for example green and red laser radiation. Suppose that the optical system for red radiation is in the top of the diagram and the optical system for green radiation is in the bottom half. Only the system for green radiation will be described. A light source in the form of a laser 702 produces light of the desired wavelength and characteristics. Fibers 704 guide the laser light towards the position sensor optical module 706. It is recalled that the mark has the form of a periodic grating, and will diffract the radiation into a plurality of discrete directions. Individual diffraction orders as reflected by the mark 402 are imaged upon separate apertures on a reference plate 710. Subsequently, the light is transferred to a series of detectors 712. An array 714 of optical wedges is provided which deflects each diffraction order in a particular direction. In this way, each diffraction order is imaged at separate place on the reference plate 710. Signals produced by the detectors can therefore be processed to distinguish a wide variety of conditions in the optical signal, and obtain more information than merely trying to image the mark using all orders at once.

As illustrated in the cited paper, a CCD sensor 720 is provided, to act as a camera looking through the optical system of the position sensor onto the substrate. This camera can therefore be used to obtain images of the substrate edge, and to measure the position of the substrate edge for use in the methods disclosed herein. By introducing an aperture device 624 as shown schematically in FIG. 7, this camera can be made into an angle-selective camera, operating as described above with reference to FIG. 6. In this way, the images captured by sensor 720 will have a particular portion of the edge bevel accentuated in them, giving an accurate reference to be used for relative position calculations in relation to the marks 402. It may be noted that the portion 636 which gives rise to the bright feature in the captured images is neither the edge of the flat portion of the substrate, nor the extreme periphery 634. Rather, it is simply a reproducible portion of the edge that can be reliably detected by exploiting the angle-selective behavior of the camera optical system. While the angle $\alpha$ may be arbitrary, it provides a consistent reference for measurement of the position of the edge.

Figure 8:
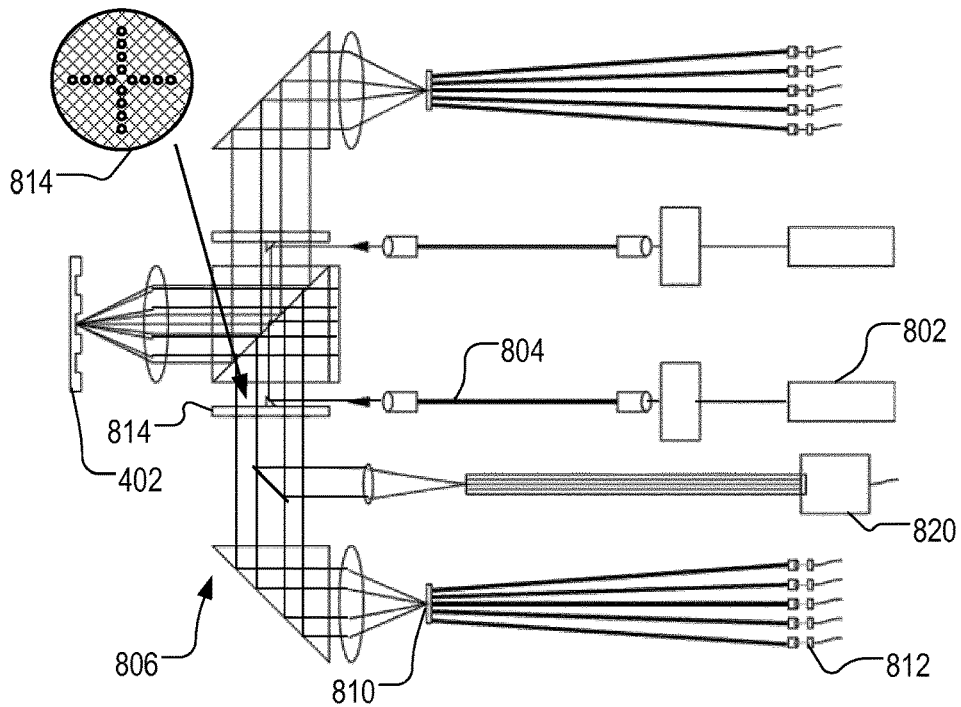

FIG. 8 illustrates another form of the alignment sensor incorporating an angle-sensitive camera. Reference signs 802 to 814 are used refer to the same features as the reference signs 702 to 714 in FIG. 7. In this example CCD sensor 820 is coupled to the optical system of the green branch of the optical system 806, downstream of the array 814 of optical wedges. As schematically illustrated in plan view, this array 814 already has the effect of passing only specific angles of radiation in alignment with the X and Y axes. Consequently, images of the form shown in FIG. 6(*c*) can be obtained from this sensor 820 without further modification of the alignment sensor. In these images, thanks to the angle-selective behavior of the optical system in which the CCD sensor 820 is mounted, a certain portion of the bevel shape of the substrate edge will be accentuated in the captured images, provided that portion is aligned with either the X axis or the Y axis.

In conclusion, FIG. 7 and FIG. 8 illustrate how optical systems already present in a common type of alignment sensor can be exploited to measure the position of the edge of the substrate, as well as performing their more normal task of measuring the positions of grating structures (alignment marks) across the substrate. The positions of the edges can be measured and the relative positions captured and reused, by simple modifications of the alignment method described above with reference to FIG. 2.

Figure 9:
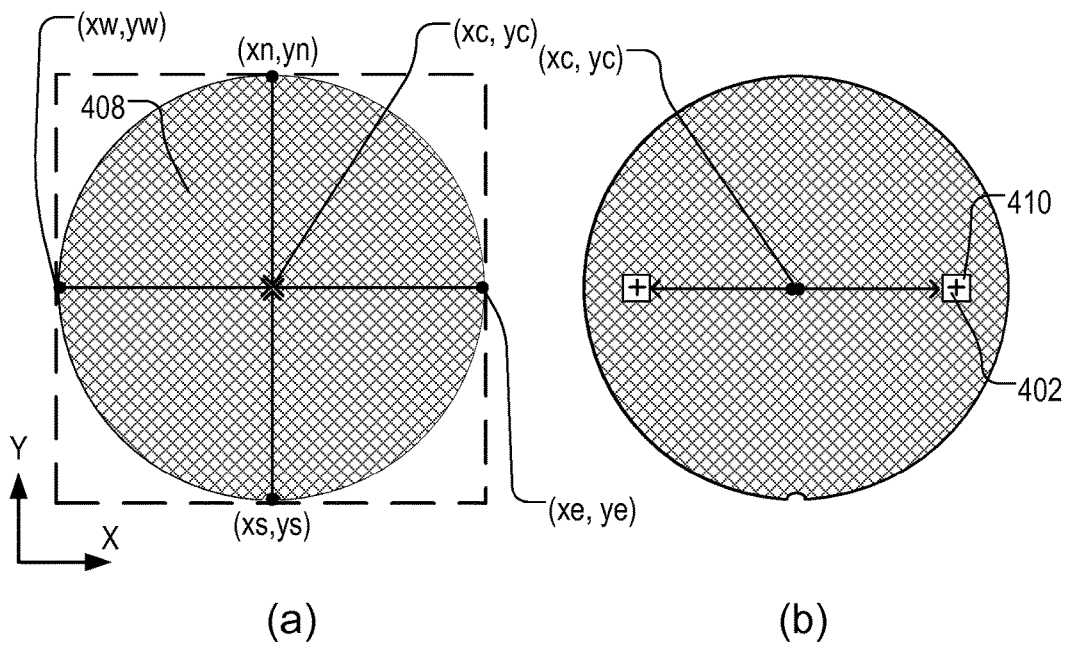
FIG. 9 illustrates the determining of the position of two target structures under an opaque layer, including determining an orientation of the substrate.

Referring now to FIG. 9(*a*) there is illustrated a plan view of the substrate, in which positions of the edge are measured in four directions. Using, for the sake of illustration, the labels North, South, East and West, the four extremities of the wafer in the X and Y directions are measured at positions (xn, yn), (xe, ye), (xs, ys) and (xw, yw). A position of the substrate center (xc, yx) can be calculated. It will be understood that all of these positions are in a coordinate system defined relative to the reference frame RF of the lithographic apparatus. Assuming that the surface of the substrate is covered by the layer 408 of opaque material, FIG. 9(*a*) shows that there is no way of detecting the positions of underlying alignment marks 402. As seen in FIG. 9(*b*), however, using relative position information recorded earlier, and using, for example, the substrate center position (xc, yc) measured by the edge sensor 412, the marks can be found in the exposed regions by suitably positioning a pattern to define windows 410.

Note that the simplified illustration of FIG. 9(*b*) assumes that the orientation of the substrate about an axis is fixed, in practice, the orientation may vary, between different times of loading the same substrate into the same or another lithographic apparatus. Accordingly, in a practical embodiment, the positions of the edges of the substrate are measured and also an orientation angle $\theta$ of the substrate is measured, relative to defined axes of the apparatus. In the case of a circular substrate, common in semiconductor manufacturing, measurement of the position of the edge does not reveal the orientation. Different methods for measuring the orientation will be described below. Whichever method is used, FIG. 9(*c*) illustrates the situation where the substrate with opaque layer 408 is misaligned, relative to the X and Y axes. Provided that the orientation is known, then it can be used, together with the measured edge positions, to position correctly the windows 410 that reveal the underlying marks 402.

In addition to the position of the substrate center, a scaling factor in X and Y directions can be calculated, if the diameter of the substrate appears to have changed between the first and second edge position measurements. This scaling factor can also be applied in calculating positions of the underlying marks. As mentioned above, the position measurements can be adjusted and calibrated, if necessary, to correct for changes in the edge region that may be caused by physical and chemical processing of the substrate between edge position measurement steps. Thus, the system can distinguish between a genuine change of size of the substrate, and an apparent movement of the edges caused locally by the processing of the edge regions. Provided the processing is reasonably consistent in its effects, the apparent movement can be predicted and corrected. Feedback can be provided to improve such predictions for future substrates.

Figure 10:
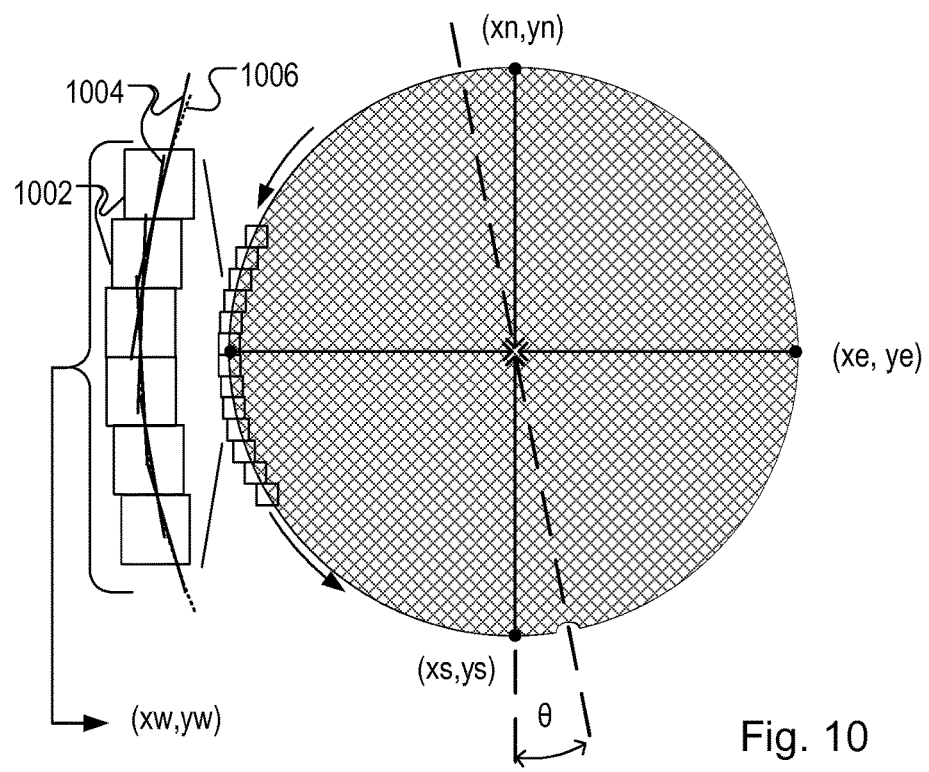
FIG. 10 illustrates schematically part of an example method for calculating a measured position for an edge region of a substrate.

FIG. 10 illustrates in enlarged detail the measurement of the edge position at the left hand (West) extremity of the substrate in FIG. 9. The processing of captured images can be done in a variety of ways. For the sake of example only, it is assumed in FIG. 10 that successive non-overlapping image frames 1002 are captured. In each frame, a line 1004 is fitted through the bright region that represents the edge, in the manner described above with reference to FIG. 6. After fitting the lines in the individual image frames, processor 606 may fit a curve 1006, as a way of calculating the extreme position (xw, yw) of the edge. As mentioned above, the field-of-view represented in each frame may be less than 1 mm, optionally less than half a millimeter, and so the number of frames captured can be far greater than illustrated schematically here. Frames may be captured, for example, at a rate of 25 frames per second. Depending on the form of aperture device, where the angle-selective camera is used, frames may be captured around the entire periphery, or only in the North, South, East and West regions.

Figures 11, 12:
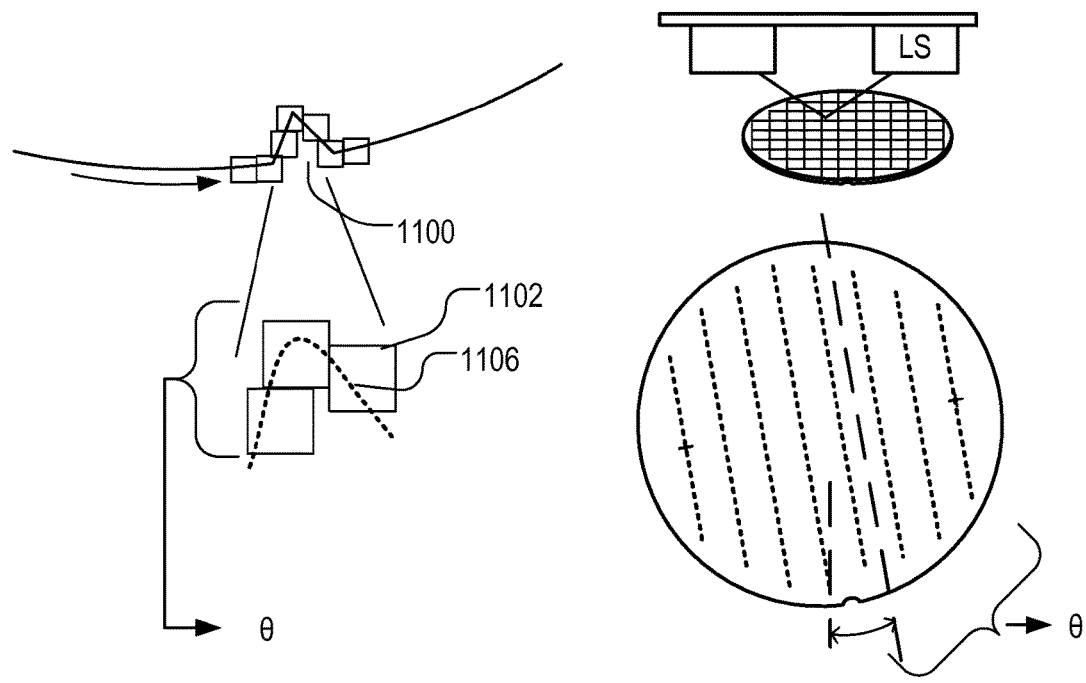
FIG. 11 illustrates a first example method for determining an orientation of the substrate.
FIG. 12 illustrates a second example method for determining an orientation of the substrate.

FIG. 11 illustrates one method of determining orientation, mentioned above with reference to FIG. 9. In this example, the substrate has a notch 1100 formed in its edge, as an orientation mark. Image frames 1102 are captured around the periphery, including a peak of the notch. As illustrated in the enlarged detail, a curve 1106, for example a parabolic curve, is fitted to the bright regions in the relevant frames, and a value of the orientation angle $\theta$ is calculated from the parameters of the fitted curve.

FIG. 12 illustrates an alternative method of measuring orientation, based on other sensor data that may be available within the lithographic apparatus. That is to say, measurement of the edge positions measurement of the orientation can be made using different sensors if desired. As one example, the height sensor LS, mentioned in the description of FIGS. 1 and 2 above, determines height variations across the substrate. In a situation where the substrate has undergone several layers of patterning and chemical/physical processing, it will normally be possible to distinguish the grid pattern of the individual device fields (dies) as periodic features in the height map. By using height data averaged over substantially the whole of the substrate, linear features such as those represented by dotted lines in enlarged plan view of FIG. 12 can be recognized. The orientation angle θ can be calculated by knowing how these are related to the patterns applied in previous layers.

Since the method of FIG. 12 does not depend on measuring positions of edges arbitrary angles in the notch region of the substrate periphery, it may be particularly suitable for use where the edge sensor 412 is an angle-selective camera incorporating the second type of aperture device 624b. Methods such as those illustrated FIGS. 11 and 12 can used in combination, to improve accuracy and/or versatility in determining the orientation.

In conclusion, it has been shown how the position of hidden features, such as marks, dies and overlying structure, can be measured indirectly, using relative position information and measurements of the substrate edge. Depending on the hardware present in the lithographic apparatus, little or no modification to existing hardware may be required. The need for expensive additional alignment mark producing steps can be avoided.

It has further been shown how an angle-selective optical system can be included in a camera, and used to measure accurately the position of the edge of the substrate. The accuracy achieved in this method may be sufficient as conventional course alignment marks become redundant, and course alignment is done entirely based on the measured positions of the edges of the substrate. It is further noted that such an angle-sensitive camera may be present already in sensing devices of lithographic apparatus and/or may be made by simple modification of those devices.

While specific embodiments of the invention have been described above, it will be appreciated that the invention may be practiced otherwise than as described.

While the example structures described above as marks are grating structures specifically designed and formed for the purposes of position measurement, in other embodiments, positions may be measured on structures which are functional parts of devices formed on the substrate. Many devices have regular, grating-like structures. The terms "mark" and "grating structure" as used herein do not require that the structure has been provided specifically for the measurement being performed. References to an opaque layer are not the only kind of overlying structure that may disrupt measurement of the position of the mark by observing the mark directly.

In association with the position measuring hardware and suitable structures realized on substrates and patterning devices, an embodiment may include a computer program containing one or more sequences of machine-readable instructions implementing methods of measurement of the type illustrated above to obtain information about the position of the mark covered by and overlying structure. A lithographic process. This computer program may be executed, for example, by a processor 606 or the like which is dedicated to that purpose, or is integrated in the control unit LACU of FIG. 1. There may also be provided a data storage medium (e.g., semiconductor memory, magnetic or optical disk) having such a computer program stored therein.

In an embodiment, there is provided a method of locating a target structure on a substrate, the target structure being obscured by an overlying structure, the method comprising: (a) providing relative position information that defines the position of the target structure relative to one or more edge portions of the substrate, the relative position information having been defined prior to formation of the overlying structure; (b) after formation of the overlying structure, measuring the positions of the edge portions; and (c) based on the positions of the edge portions measured in step (b) and the relative position information provided in step (a), deriving a position of the target structure, wherein in one or both of steps (a) and (b) the position of the edge portion is measured by using a camera to acquire images of an edge region of the substrate, and wherein an optical system of the camera is angle-selective such that a portion of the edge region having a specific bevel angle is accentuated in the images.

In an embodiment, the method further comprises using the derived position of the target structure to remove a portion of the overlying structure to reveal the target structure. In an embodiment, step (b) further comprises determining an orientation of the substrate, and step (c) uses the determined orientation in deriving the position of the target structure in step (c), wherein the orientation of the substrate is measured by recognizing the orientation of a pattern distributed across the substrate. In an embodiment, the distributed pattern is recognized in topographic variations obtained by measuring a height across a surface of the substrate. In an embodiment, step (a) includes: (a1) prior to formation of the target structure, measuring the positions of the edge portions; and (a2) forming the target structure at a position defined relative to the measured positions of the edge portions of the substrate. In an embodiment, step (a) includes: (a1) after formation of the target structure but prior to the formation of the overlying structure, measuring the positions of the edge portions and measuring the position of the target structure; and (a2) recording the relative position information for subsequent use in step (c), based on the positions measured in step (a1).

In an embodiment, there is provided an apparatus for locating a target structure on a substrate, the apparatus comprising: storage for relative position information that defines the position of the target structure relative to one or more edge portions of the substrate; an edge position sensor operable to measure the positions of the edge portions; and a processor arranged to calculate, based on measured positions of the edge portions and the relative position information provided in the storage, deriving a position of the target structure, wherein the edge position sensor comprises a camera operable to acquire images of an edge region of the substrate, and wherein an optical system of the camera is angle-selective such that a portion of the edge region having a specific bevel angle is accentuated in the images.

In an embodiment, the optical system of the camera comprises an angle-selective aperture device which is arranged to pass rays reflected from the substrate edge having a predetermined angle. In an embodiment, the edge position sensor is operable to measure the positions of the edge portions while an overlying structure obscures the target structure, and wherein the apparatus further comprises a position sensor operable to measure more accurately the position of the target structure than the position that is derived based on measured positions of the edge portions and the relative position information provided in the storage, after a portion of the overlying structure has been removed. In an embodiment, the camera forms part of the position sensor for measuring more accurately the position of the target structure.

In an embodiment, there is provided a lithographic apparatus for use in applying a pattern to a substrate, the lithographic apparatus including an apparatus as described herein and a controller for using the calculated position of the target structure to control the positioning of one or more patterns applied to the substrate.

In an embodiment, there is provided a lithographic apparatus for use in applying a pattern to a substrate, the lithographic apparatus including an apparatus as described herein and a controller for controlling the positioning of a pattern defining the target structure using the measured positions of the edge portions of the substrate.

In an embodiment, there is provided a method of measuring the position of a substrate wherein a camera is used to acquire images of an edge region of the substrate, wherein an optical system of the camera is angle-selective such that a portion of the edge region having a specific bevel angle is accentuated in the images.

In an embodiment, there is provided an apparatus for measuring the position of a substrate, the apparatus comprising a camera operable to acquire images of an edge region of the substrate, wherein an optical system of the camera is angle-selective such that a portion of the edge region having a specific bevel angle is accentuated in the images.

In an embodiment, there is provided a computer program product comprising machine-readable instructions for causing a programmable processor to control the performance of a method as described herein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method of locating a target structure on a substrate, the target structure being obscured by an overlying structure, the method comprising:

(a) providing relative position information that defines the position of the target structure relative to one or more edge portions of the substrate, the relative position information having been defined prior to formation of the overlying structure;

(b) after formation of the overlying structure, measuring the positions of a plurality of edge portions of the substrate; and (c) based on the measured positions of the edge portions and the relative position information, deriving a position of the target structure, wherein in step (a), or in step (b), or in both of steps (a) and (b) the position of an edge portion is measured by using a camera to acquire images of an edge region of the substrate, and wherein an optical system of the camera is angle-selective such that a portion of the edge region having a specific bevel angle is accentuated in the images.

2. The method as claimed in claim 1, further comprising using the derived position of the target structure to remove a portion of the overlying structure to reveal the target structure.

3. The method as claimed in claim 1, further comprising determining an orientation of the substrate, and using the determined orientation in the deriving of the position of the target structure, wherein the orientation of the substrate is determined by recognizing an orientation of a pattern distributed across the substrate.

4. The method as claimed in claim 3, wherein the distributed pattern is recognized in topographic variations obtained by measuring a height across a surface of the substrate.

5. The method as claimed in claim 1, wherein step (a) includes:

prior to formation of the target structure, measuring positions of edge portions; and forming the target structure at a position defined relative to the measured positions of the edge portions of the substrate.

6. The method as claimed in claim 1, wherein step (a) includes:

after formation of the target structure but prior to the formation of the overlying structure, measuring positions of edge portions and measuring the position of the target structure; and recording the relative position information for subsequent use in step (c), based on the measured positions of the edge portions and the measured position of the target structure.

7. An apparatus for locating a target structure on a substrate, the apparatus comprising:

storage for relative position information that defines the position of the target structure relative to one or more edge portions of the substrate;

an edge position sensor operable to measure the positions of a plurality of edge portions of the substrate; and a processor arranged to calculate, based on measured positions of the edge portions and the relative position information provided in the storage, a position of the target structure;

wherein the edge position sensor comprises a camera operable to acquire images of an edge region of the substrate, and wherein an optical system of the camera is angle-selective such that a portion of the edge region having a specific bevel angle is accentuated in the images.

8. The apparatus as claimed in claim 7, wherein the optical system of the camera comprises an angle-selective aperture device which is arranged to pass rays reflected from the substrate edge having a predetermined angle.

9. The apparatus as claimed in claim 7, wherein the edge position sensor is configured to measure the positions of the edge portions while an overlying structure obscures the target structure, and wherein the apparatus further comprises a position sensor configured to measure more accurately the position of the target structure than the position that is derived based on measured positions of the edge portions and the relative position information provided in the storage, after a portion of the overlying structure has been removed.

10. The apparatus as claimed in claim 9, wherein the camera forms part of the position sensor configured to measure more accurately the position of the target structure.

11. A lithographic apparatus for use in applying a pattern to a substrate, the lithographic apparatus including the apparatus as claimed in claim 7 and a controller configured to use the calculated position of the target structure to control positioning of one or more patterns applied to the substrate.

12. A lithographic apparatus for use in applying a pattern to a substrate, the lithographic apparatus including the apparatus as claimed in claim 7 and a controller configured to control positioning of a pattern defining the target structure using the measured positions of the edge portions of the substrate.

13. A method comprising measuring the position of a substrate wherein a camera is used to acquire images of an edge region of the substrate, wherein an optical system of the camera is angle-selective such that a portion of the edge region having a specific bevel angle is accentuated in the images.

14. An apparatus for measuring the position of a substrate, the apparatus comprising a camera configured to acquire images of an edge region of the substrate, wherein an optical system of the camera is angle-selective such that a portion of the edge region having a specific bevel angle is accentuated in the images.

15. The apparatus as claimed in claim 14, wherein the optical system of the camera comprises an angle-selective aperture device which is arranged to pass rays reflected from the substrate edge having a predetermined angle.

16. The apparatus as claimed in claim 14, wherein the camera is configured to acquire the images while an overlying structure obscures a target structure, and wherein the apparatus further comprises a position sensor configured to measure more accurately the position of the target structure than a position that is derived based on the acquired images, after a portion of the overlying structure has been removed.

17. The apparatus as claimed in claim 16, wherein the camera forms part of the position sensor configured to measure more accurately the position of the target structure.

18. A non-transitory computer program product comprising machine-readable instructions that, when executed by a programmable processor, are configured to enable the programmable processor to cause at least:
  (a) obtaining of relative position information that defines the position of a target structure on a substrate relative to one or more edge portions of the substrate, the relative position information having been defined prior to formation of an overlying structure that obscures the target structure;
  (b) after formation of the overlying structure, obtain measurements of the positions of a plurality of edge portions of the substrate; and
  (c) based on the measured positions of the edge portions and the relative position information, derive a position of the target structure,
  wherein in (a), in (b), or in both (a) and (b) the position of an edge portion is measured by using a camera to acquire images of an edge region of the substrate, and
  wherein an optical system of the camera is angle-selective such that a portion of the edge region having a specific bevel angle is accentuated in the images.

19. The computer program product as claimed in claim 18, wherein the instructions are further configured to enable the programmable processor to cause use of the derived position of the target structure to remove a portion of the overlying structure to reveal the target structure.

20. The computer program product as claimed in claim 18, wherein the instructions are further configured to enable the programmable processor to cause determination of an orientation of the substrate, and use of the determined orientation in the derivation of the position of the target structure, wherein the orientation of the substrate is determined by recognition of an orientation of a pattern distributed across the substrate.

* * * * *